(12) United States Patent
Reiber (10) Patent No.: US 7,032,802 B2
(45) Date of Patent: *Apr. 25, 2006

(54) BONDING TOOL WITH RESISTANCE (76) Inventor: Steven F. Reiber, 4409 Vivien Way Rocklin, Rocklin, CA (US) 95677

( * ) Notice: Subject to any disclaimer, the term of this patent is extended or adjusted under 35 U.S.C. 154(b) by 0 days.

This patent is subject to a terminal disclaimer.

(21) Appl. No.: 10/943,151

(22) Filed: Sep. 15, 2004

(65) Prior Publication Data

US 2005/0109814 A1   May 26, 2005

Related U.S. Application Data

(63) Continuation-in-part of application No. 10/650,169, filed on Aug. 27, 2003, now Pat. No. 6,935,548, which is a continuation of application No. 10/036,579, filed on Dec. 31, 2001, now Pat. No. 6,651,864, and a continuation-in-part of application No. 09/514,454, filed on Feb. 25, 2000, now Pat. No. 6,354,479.

(60) Provisional application No. 60/503,267, filed on Sep. 15, 2003, provisional application No. 60/288,203, filed on May 1, 2001, provisional application No. 60/121,694, filed on Feb. 25, 1999.

(51) Int. Cl.
*B23K 37/00* (2006.01)
*B23K 31/00* (2006.01)

(52) U.S. Cl. ..................... 228/4.5; 228/180.5

(58) Field of Classification Search ............... 228/1.1, 228/4.5, 6.1, 6.2, 180.5; 219/56.21, 56.22
See application file for complete search history.

(56) References Cited

U.S. PATENT DOCUMENTS

| | | | |
|---|---|---|---|
| 2,892,924 A | 6/1959 | Wood | |
| 3,538,205 A | 11/1970 | Gates, Jr. et al. | |
| 3,563,443 A | 2/1971 | Perdotti et al. | |
| 3,660,050 A | 5/1972 | Iler et al. | |
| 3,938,722 A | 2/1976 | Kelly et al. | |
| 3,986,255 A | 10/1976 | Mandal | |
| 3,986,653 A | 10/1976 | Gilding | |
| 4,020,543 A | 5/1977 | Pennings | |
| 4,157,932 A | 6/1979 | Hirata | |
| 4,171,477 A | 10/1979 | Funari | |
| 4,182,947 A | 1/1980 | Brower | |
| 4,315,128 A | 2/1982 | Matcovich et al. | |
| 4,331,048 A | 5/1982 | Dworak et al. | |
| 4,387,283 A | 6/1983 | Peterson et al. | |
| 4,390,771 A | 6/1983 | Kurtz et al. | |
| 4,502,983 A | 3/1985 | Omori et al. | |
| 4,513,190 A | 4/1985 | Ellett et al. | |
| 4,554,033 A | 11/1985 | Dery et al. | |
| 4,555,052 A | 11/1985 | Kurtz et al. | |

(Continued)

FOREIGN PATENT DOCUMENTS

EP   0435423   7/1991

(Continued)

OTHER PUBLICATIONS

U.S. Appl. No. 10/942,311, filed Sep. 15, 2004, Reiber, Flip Chip Bonding Tool Tip.

(Continued)

*Primary Examiner*—Lynne R. Edmondson
(74) *Attorney, Agent, or Firm*—Carr & Ferrell LLP (57) ABSTRACT

A resistive bonding tool tip comprising a resistive material with a resistance low enough to prevent a discharge of a charge to a device being bonded and high enough to avoid current flow large enough to damage the device being bonded is disclosed.

13 Claims, 7 Drawing Sheets

NORMAL CAPILLARY

U.S. PATENT DOCUMENTS

| | | | |
|---|---|---|---|
| 4,691,854 A | 9/1987 | Haefling et al. | |
| 4,705,204 A | 11/1987 | Hirota et al. | |
| 4,772,498 A | 9/1988 | Bertin et al. | |
| 4,821,944 A | 4/1989 | Tsumura | |
| 4,842,662 A | 6/1989 | Jacobi | |
| 4,897,710 A | 1/1990 | Suzuki et al. | |
| 4,899,921 A | 2/1990 | Bendat et al. | |
| 4,909,427 A | 3/1990 | Plaisted et al. | |
| 4,998,002 A | 3/1991 | Okikawa et al. | |
| 5,123,935 A | 6/1992 | Kanamaru et al. | |
| 5,178,742 A | 1/1993 | Lemke et al. | |
| 5,180,093 A | 1/1993 | Stansbury et al. | |
| 5,214,259 A | 5/1993 | Terakado et al. | |
| 5,217,154 A | 6/1993 | Elwood et al. | |
| 5,250,843 A | 10/1993 | Eichelberger | |
| 5,280,979 A | 1/1994 | Poli et al. | |
| 5,290,507 A | 3/1994 | Runkle | |
| 5,341,979 A | 8/1994 | Gupta | |
| 5,347,086 A | 9/1994 | Potter et al. | |
| 5,367,956 A | 11/1994 | Fogle, Jr. | |
| 5,427,301 A | 6/1995 | Pham et al. | |
| 5,463,197 A | 10/1995 | Miyazaki | |
| 5,491,605 A | 2/1996 | Hughbanks et al. | |
| 5,527,441 A | 6/1996 | Offer | |
| 5,544,804 A | 8/1996 | Test et al. | |
| 5,601,740 A | 2/1997 | Eldridge et al. | |
| 5,616,257 A | 4/1997 | Harada et al. | |
| 5,649,355 A | 7/1997 | Offer | |
| 5,651,901 A | 7/1997 | Mohri et al. | |
| 5,676,856 A | 10/1997 | Haji et al. | |
| 5,797,388 A | 8/1998 | Nakamura et al. | |
| 5,816,472 A | 10/1998 | Linn | |
| 5,827,470 A | 10/1998 | Chatterjee et al. | |
| 5,931,368 A | 8/1999 | Hadar et al. | |
| 6,030,472 A | 2/2000 | Hajaligol et al. | |
| 6,073,827 A | 6/2000 | Razon et al. | |
| 6,219,911 B1 | 4/2001 | Estes et al. | |
| 6,337,522 B1 | 1/2002 | Kang et al. | |
| 6,354,479 B1 * | 3/2002 | Reiber et al. | 228/4.5 |
| 6,646,355 B1 | 11/2003 | Kang et al. | |
| 6,651,864 B1 * | 11/2003 | Reiber et al. | 228/4.5 |
| 6,759,642 B1 | 7/2004 | Hoshino | |
| 2005/0109817 A1 * | 5/2005 | Reiber | 228/49.6 |

FOREIGN PATENT DOCUMENTS

| | | |
|---|---|---|
| GB | 2287897 | 10/1995 |
| JP | 54037114 | 3/1979 |
| JP | 63164228 | 7/1988 |
| JP | 02-67741 | 3/1990 |
| JP | 04-149065 | 5/1992 |
| JP | 06-45389 | 2/1994 |

OTHER PUBLICATIONS

Stan Weitz, "Trends in ESD Test Methods," Materials Testing Section of the ETS Testing Laboratory, Electrotech Systems, 1998, pp. 1-7.

Instrument FAQs, Drivers, Libraries and Examples, Keithley Instrument Model 6517/6517A, Keithley Instruments, Inc., 1999, pp. 1-2.

Keithley Instruments Model 6517A Electrometer/High Resistance Meter, Keithley Instruments, Inc., pp. 1-9 (date unknown).

"Low-Current/High-Resistance Meters," Keithley Instruments Model 6517A, Keithley Instruments, Inc. pp. 112-115 (date unknown).

Keytech 200 XV-2 ESD Simulator, Kandus Equipment, p. 1 (date unknown).

Newburg, Carl E., "Test Report", Anza Technology, Incorporated Static Dissipative Ceramic Rods . . . Report 190:2000-92, River's Edge Technical Service, Nov. 29, 2000, pp. 1-5.

Huntsman, James et al., "Test Methods for Static Control Products," Electrical Overstress/Electrostatic Discharge Sym., Sep. 21, 1982, pp. 94-109, v1.4, IIT Rsrch Inst.

* cited by examiner

FIG. 3
BOTTLE-NECK CAPILLARY
PRIOR ART

FIG. 2
NORMAL CAPILLARY
PRIOR ART

FIG. 5B
TIP DETAIL
PRIOR ART

TIP DETAIL
FIG. 9

BOTTLE-NECK CAPILLARY
FIG. 8

NORMAL CAPILLARY
FIG. 7

BONDING TOOL WITH RESISTANCE

CROSS REFERENCE TO RELATED APPLICATIONS

This application is a continuation-in-part and claims the priority benefit of U.S. patent application Ser. No. 10/650,169 filed Aug. 27, 2003, now U.S. Pat. No. 6,935,548, entitled "Dissipative Ceramic Bonding Tool Tip," which is a continuation of U.S. patent application Ser. No. 10/036,579 filed Dec. 31, 2001, now U.S. Pat. No. 6,651,864, entitled "Dissipative Ceramic Bonding Tool TiP," which claims the priority benefit of U.S. provisional patent application No. 60/288,203 filed May 1, 2001, and is also a continuation-in-part of U.S. patent application Ser. No. 09/514,454 filed Feb. 25, 2000, now U.S. Pat. No. 6,354,479 and entitled "Dissipative Ceramic Bonding Tool Tip," which claims the priority benefit of provisional patent application No. 60/121,694 filed Feb. 25, 1999; this application also claims the priority benefit of U.S. provisional patent application No. 60/503,267 filed Sep. 15, 2003 entitled "Bonding Tool." This application is related to co-pending U.S. patent application Ser. No. 10/942,311 filed Sep. 15, 2004 entitled "Flip Chip Bonding Tool Tip." The contents of all of these applications are incorporated herein by reference.

BACKGROUND OF THE INVENTION

1. Field of the Invention

This invention relates to bonding tool tips with resistance and, more particularly, to bonding tool tips with 500 to 99,999 ohms of resistance for bonding electrical connections.

2. Description of the Prior Art

Integrated circuits are typically attached to a lead frame and individual leads are connected to individual bond pads on the integrated circuit with wire. The wire is fed through a tubular bonding tool tip having a bonding pad at the output end. These tips are commonly called capillary tips. An electrical discharge at the bonding tool tip supplied by a separate EFO (electronic flame off) device melts a bit of the wire thereby forming a bonding ball.

Other bonding tools do not have a center tube, but have a feedhole or other feature for feeding the wire as needed. Some bonding tips have no such wire arrangement as the wire is supplied at the location where the wire is insulated and bonded to a magnetic head and then to a flexible wire circuit. Such is the case in magnetic disk recording devices.

When a bonding tip is on the integrated circuit die side of a wire connection, the wire will form a ball on the end of the wire, as above, before reaching the next die bonding pad. The ball then makes intimate contact with a film formed on the die pad on the integrated circuit. The bonding tip is then moved from the integrated circuit die pad, with gold wire being fed out as the tool is moved, onto the bond pad on the lead frame, and then scrubbed laterally by an ultrasonic transducer. Pressure from the bonding tool tip, the transducer, and capillary action, 'flows' the wire onto the bonding pad where molecular bonds produce a reliable electrical and mechanical connection.

Bonding tool tips must be sufficiently hard to prevent deformation under pressure and mechanically durable so that many bonds can be made before replacement. Prior art bonding tool tips are made of aluminum oxide, which is an insulator, but provide the durability to form thousands of bonding connections.

Bonding tool tips should also be electrically designed to produce a reliable electrical contact yet prevent electrostatic discharge damage to the part being bonded. Certain prior art devices have a one-or-more volt emission when the tip makes bonding contact. This could present a problem as a one-volt static discharge could generate a 20 milliamp current to flow, which, in certain instances, could cause the integrated circuit to fail due to this unwanted current.

SUMMARY OF THE INVENTION

Bonding tools with 500 to 99,999 ohms of resistance for bonding electrical connections to bonding pads on electrical devices are disclosed. In accordance with the principles of the present invention, the range of resistance needs to be lower as the electro-static discharge (ESD) voltages get smaller to avoid damaging delicate electronic devices by any electrostatic discharge. A bonding tool tip must conduct electricity at a rate sufficient to prevent charge buildup and stop all transient currents, but not at so high a rate as to trap voltage in the device being bonded. In other words, it is desirable for the bonding tip to discharge as fast as possible, but have less than 5 milliamps of current. The tip should also discharge or block any sudden surges of current that could damage the part being bonded.

In exemplary embodiments, a resistance in the tip assembly ranges from 500 to 99,999 ohms. The bonding tools also comprise specific mechanical properties to function satisfactorily.

In the present invention, bonding tool tips with the desired electrical conduction can be made with three different configurations. In the first configuration, tools are made from a uniform extrinsic semi-conducting material that has dopant atoms in appropriate concentration and valence states to produce sufficient mobile charge carrier densities—unbound electrons or holes—that will result in electrical conduction in a desired range. Polycrystalline silicon carbide uniformly doped with boron is an example of such a uniform extrinsic semi-conducting material.

In a second configuration, the tools are made by forming a thin layer of a highly doped semi-conductor on an insulating core. In this instance, the core provides mechanical stiffness, while the semi-conductor surface layer provides abrasion resistance and a charge carrier path from tip to mount that will permit dissipation of electrostatic charge at an acceptable rate. A diamond tip wedge that is ion implanted with boron is an example of such a thin layered tool.

In a third configuration, the tools are made by forming a lightly doped semi-conductor layer on a conducting core. The conducting core provides mechanical stiffness, while the semi-conductor layer provides abrasion resistance and a charge carrier path from tip to conducting core, which is electrically connected to the mount. The doping level is chosen to produce conductivity through the layer which will permit dissipation of electrostatic charge at an acceptable rate. A cobalt-bonded tungsten carbide coated with titanium nitride carbide is an example of such a lightly doped tool.

DETAILED DESCRIPTION OF AN EXEMPLARY EMBODIMENT

Figure 1:
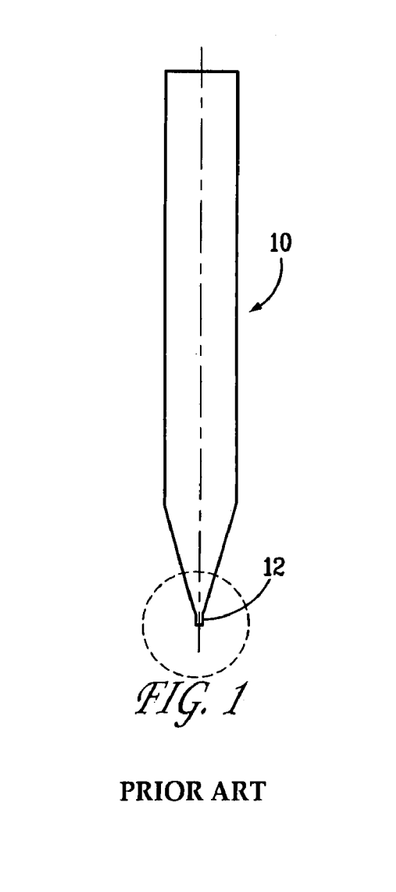
FIG. 1 is a cross-sectional view of a capillary bonding tool tip.

FIG. 1 illustrates an exemplary capillary bonding tool 10. In one embodiment, the bonding tool 10 is about one-half inch (e.g., 12–13 mm) long and about one-sixteenth inch (i.e., 1.6 mm) in diameter. A bonding tool tip 12 is, in exemplary embodiments, 3 to 10 mils (e.g., 0.08 to 0.25 mm) long. Running a length of the bonding tool 10, but not viewable in FIG. 1, is a tube hole, which will accommodate a continuously fed length of gold wire (not shown).

Figure 2:
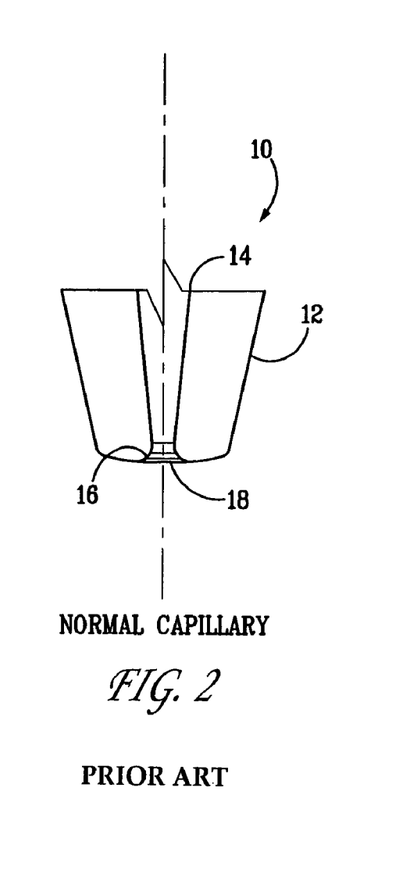
FIG. 2 is an enlarged cross-sectional view of the capillary-type construction of the operating end or tip of the bonding tool of FIG. 1.

FIG. 2 is an enlarged, cross-sectional view of the capillary bonding tool 10 of FIG. 1. Only that portion of the bonding tool 10 shown within the dotted circle in FIG. 1 is shown in FIG. 2. Tool tip 12 has the tube hole 14 which may run the entire length of bonding tool 10.

Exit hole 18 is where the wire (not shown) exits tool tip 12. If a ball is formed on the wire, the ball will be seen immediately adjacent the exit hole 18. A chamfer surface 16, at the exit hole 18, accommodates the ball that has been formed at the end of the gold wire. The chamfer surface 16 is provided to allow for smoother looping of the wire as the bonding tool 10 is moved from a bonding pad on an integrated circuit to a bonding pad (not shown) on a lead frame of an integrated circuit assembly. A wedge tool for disk drive bonding is used to capture the insulated wire, lay it on the head, and ultrasonically bond it there.

Figure 3:
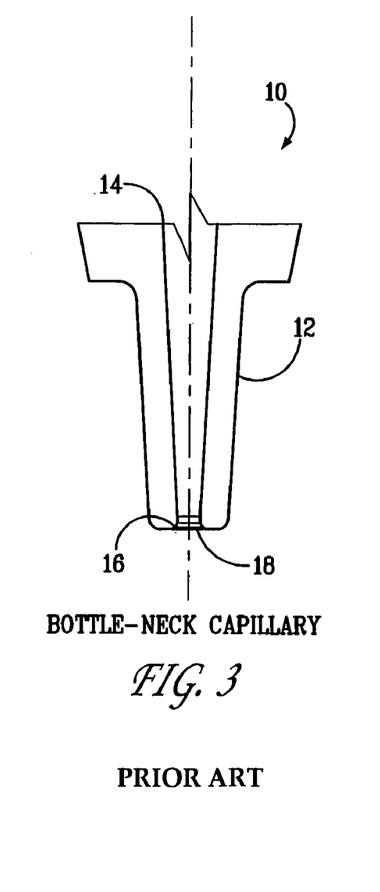
FIG. 3 is a cross-sectional view of a bottle-neck capillary bonding tool tip.

FIG. 3 is an alternative embodiment of a bonding tool 10 showing similar features: tube hole 14, chamfer surface 16, and exit hole 18. This bonding tool tip 12, referred to as a bottle-neck capillary tip, is provided for narrower bond situations where the bonding pitch—the distance between the centers of the bonding pads—is smaller. This design is necessitated, in part, by the dimensions of an integrated circuit getting smaller or the number of circuits on a chip increasing, but the die area remaining more or less constant.

Figure 4:
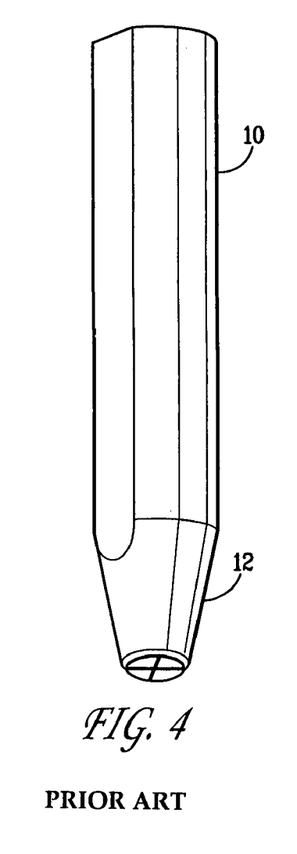
FIG. 4 is an isometric view of a wedge design bonding tool tip.

FIG. 4 shows another type of bonding tool 10. The embodiment of FIG. 4 is used with an integrated circuit die mounted on a lead frame (not shown). In this instance, wires from an integrated circuit are not connected from a die to connections directly in an integrated circuit package, but from an integrated circuit die to a lead frame.

Figures 5A, 5B:
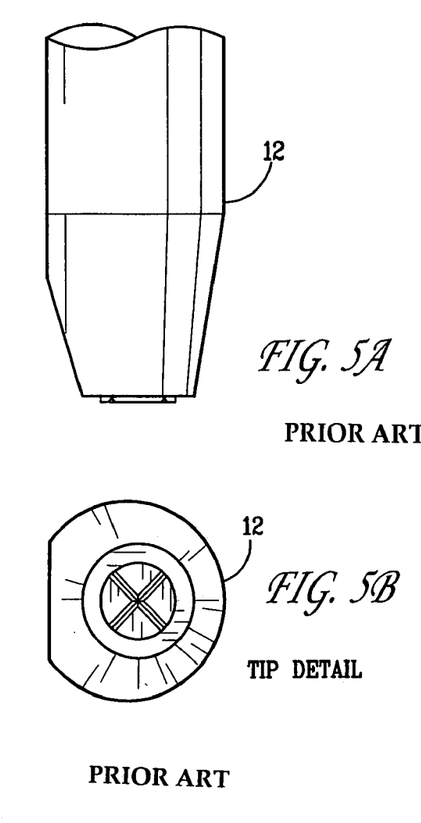
FIGS. 5a and 5b are top and front views, respectively, of the wedge design bonding tool tip of FIG. 4.

As the composition of the lead frame is different than the composition of an integrated circuit package, the tip 12 of the bonding tool 10 must be different to accommodate the different physical attributes of the integrated circuit lead frame as seen in FIGS. 5a and 5b, which are magnified views of FIG. 4 offering more explicit tip detail.

Figure 6:
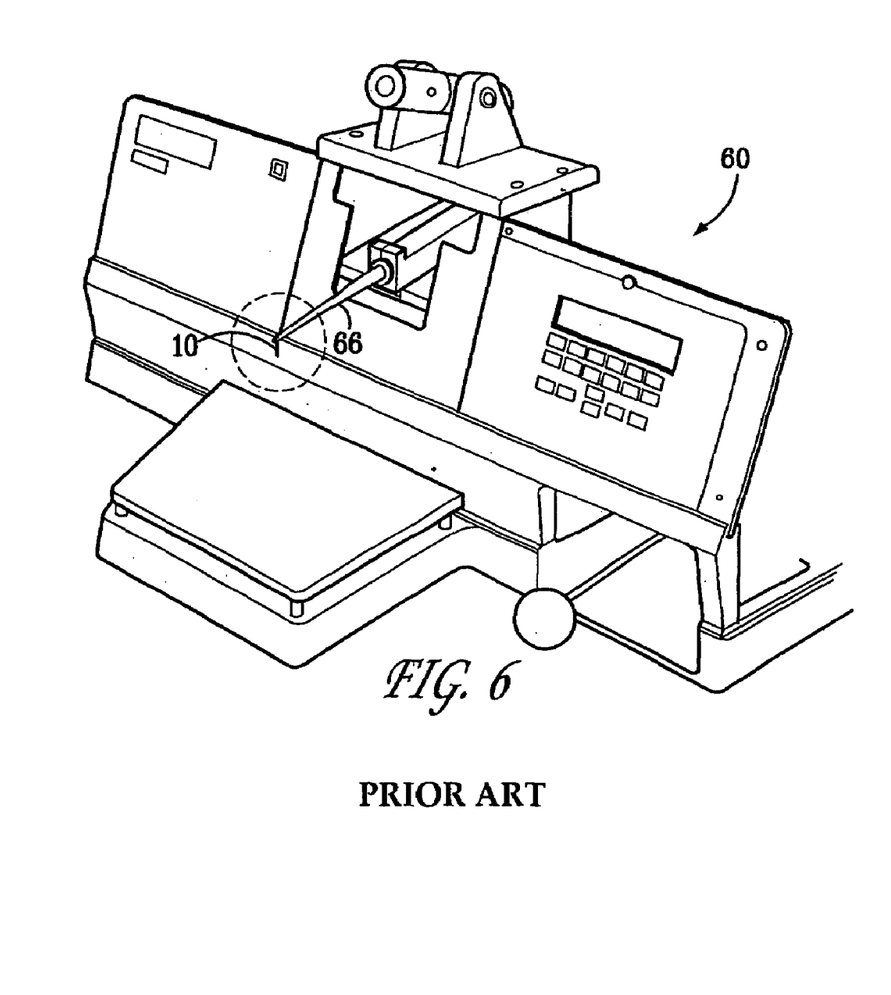
FIG. 6 is an isometric view of a typical commercial apparatus utilized in the wire bonding of a semi-conductor integrated circuit chip or other apparatus.

FIG. 6 illustrates a typical wire bonding machine 60 for use in bonding wire leads in magnetic disk drive units. Shown within the dotted circle is bonding tool 10. Bonding tool 10 is mounted to arm 66, which is moved in the desired directions by the apparatus of wire bonding machine 60. Such a machine is available as Model 7400 from West-Bond, Inc. of Anaheim, Calif.

Typical bonding tips available on the market today are made of an insulator of alumina ($Al_2O_3$), sometimes termed aluminum oxide. Alumina is a hard compound successfully used on commercial machines to provide a reasonably long life in use as a wire bonding tool. To ensure insulation, no conductive binders are used in these bonding tips. As stated previously, however, the problem is that an electrostatic discharge from the bonding tool 10 making contact with the bonding pad of the desired circuit can damage the very circuit it is wiring.

In accordance with the principles of the present invention, to avoid damaging delicate electronic devices by an electrostatic discharge, the bonding tool tip 12 must conduct electricity at a rate sufficient to prevent charge buildup and to dissipate the charge in the device, if any, but not at so high a rate as to overload a device being bonded.

It has been determined that as voltages become lower during the manufacturing process, the resistance range can become lower too. The resistance should be low enough so that material can dissipate small voltages very quickly yet keep the current below 5 milliamps. The resistance should also be high enough so that if it is not a conductor, a transient current can flow through the tool to the device.

In an exemplary embodiment, resistance in the tip assembly should range from 500 to 99,000 ohms of resistance. For example, for today's magnetic recording heads, 5 milliamps of current will result in damage. As such, it is preferred that no more than 2 to 3 milliamps of current be allowed to pass through the tip 12 of the bonding tool 10 to the recording head.

The bonding tool 10 also has specific mechanical properties to function satisfactorily. High stiffness and high abrasion resistance requirements have limited possible materials, for example, to ceramics (electrical non-conductors) or metal, such as tungsten carbide (electrical conductor). The exemplary tool tip 12 should have a Rockwell hardness of about 85 or above, preferably of about 89 or above. Additionally, the tool tip 12 needs to be able to last for at least 30,000 bonding cycles.

In the present invention, bonding tool tips with the desired electrical conduction can be made with three different configurations. First, the tools can be made from a uniform extrinsic semi-conducting material which has dopant atoms in appropriate concentration and valence states to produce sufficient mobile charge carrier densities—unbound electrons or holes—which will result in electrical conduction in a desired range. Polycrystalline silicon carbide uniformly doped with boron is an example of such a uniform extrinsic semi-conducting material.

Second, the tools can be made by forming a thin layer of a highly doped semi-conductor on an insulating core. In this instance, the core provides mechanical stiffness while the semi-conductor surface layer provides abrasion resistance and a charge carrier path from tip to mount that will permit dissipation of electrostatic charge at an acceptable rate. A diamond tip wedge that is ion implanted with boron is an example of such a thin layered tool.

Third, the tools can be made by forming a lightly doped semi-conductor layer on a conducting core. The conducting core provides mechanical stiffness while the semi-conductor layer provides abrasion resistance and a charge carrier path from tip to conducting core, which is electrically connected to the mount. A doping level is chosen to produce conductivity through the layer which will permit dissipation of electrostatic charge at an acceptable rate. A cobalt-bonded tungsten carbide coated with titanium nitride carbide is an example of such a lightly doped tool.

Figure 7:
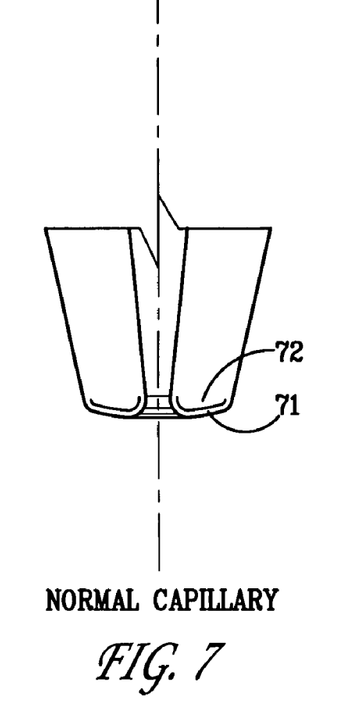
FIG. 7 is a cross-section of an embodiment of FIG. 2 having two layers.
Figure 8:
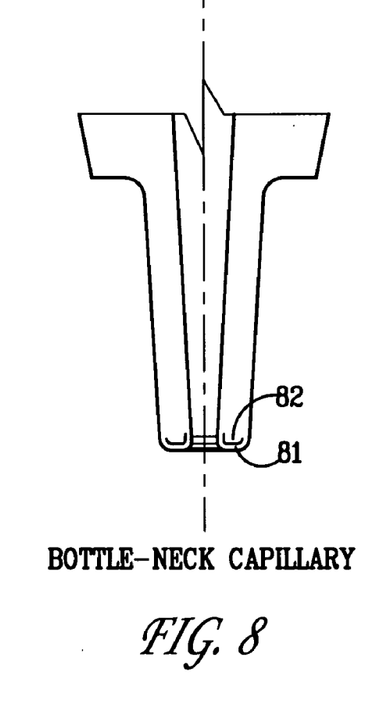
FIG. 8 is a cross-section of an embodiment of FIG. 3 having two layers.
Figure 9:
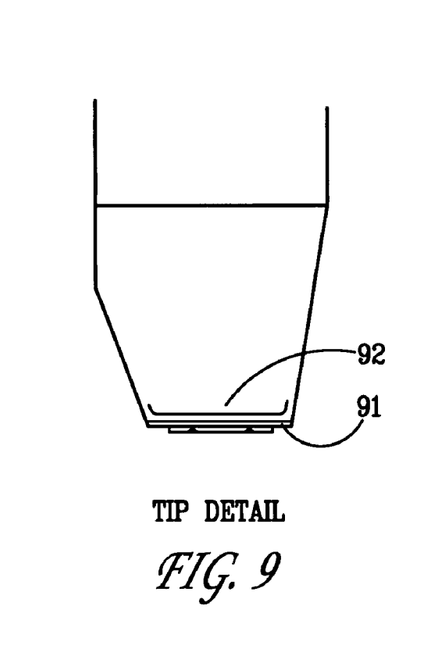
FIG. 9 a cross-section of an embodiment of FIG. 5 having two layers.

FIGS. 7, 8 and 9 illustrate a two-layered structure of capillary, bottle-neck, and wedge designs. These structures are not intended to be specific to the type of tool tip 12, but for use in any bonding tool tip. Outer layers are labeled 71, 81, and 91, respectively, and cores are labeled 72, 82, and 92, respectively.

In one two-layered configuration, layers 71, 81 and 91 are highly doped semi-conductors and cores—72, 82 and 92—are insulators. In another two-layered configuration, layers 71, 81 and 91 are lightly doped semi-conductors and cores—72, 82 and 92—are conductors. No significance should be given to the relative thickness or scale of the portions of the layers. Layers may or may not have a uniform thickness.

Figure 10:
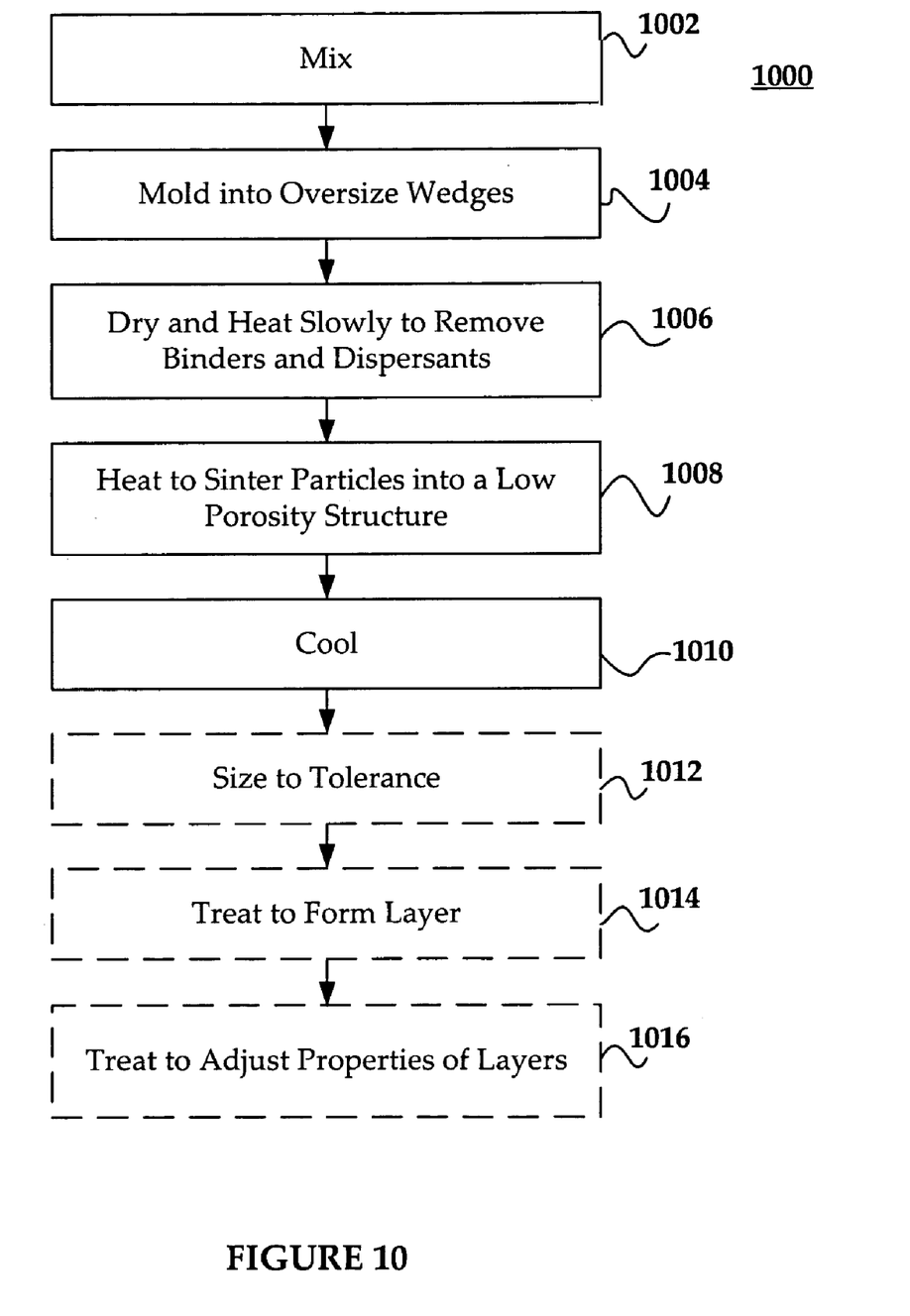
FIG. 10 is an exemplary method for manufacturing a bonding tool tip with resistance through the use of mixing, molding, and sintering reactive powders.
Figure 11:
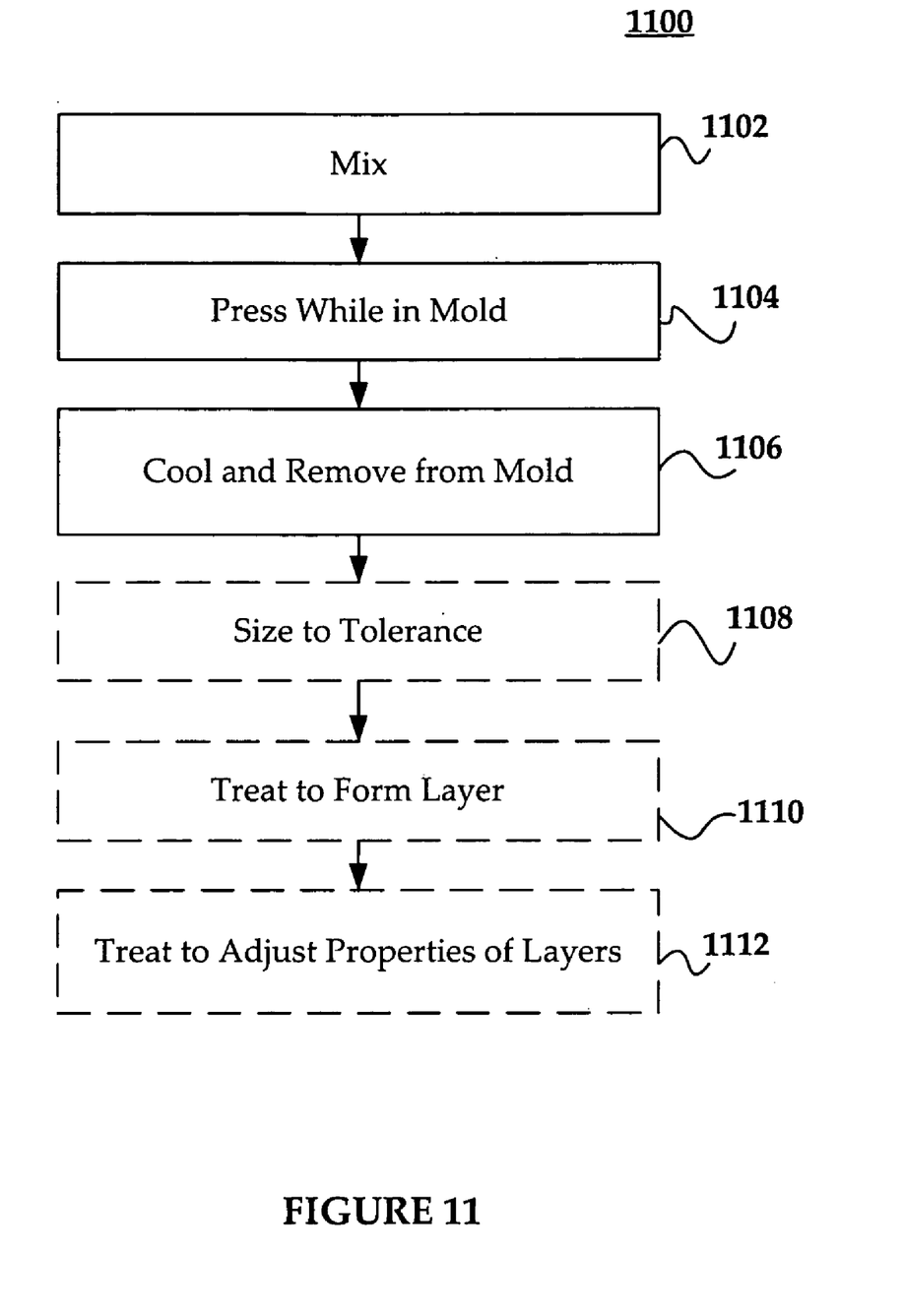
FIG. 11 is an exemplary method for manufacturing a bonding tool tip with resistance through the use of hot pressing reactive powders.
Figure 12:
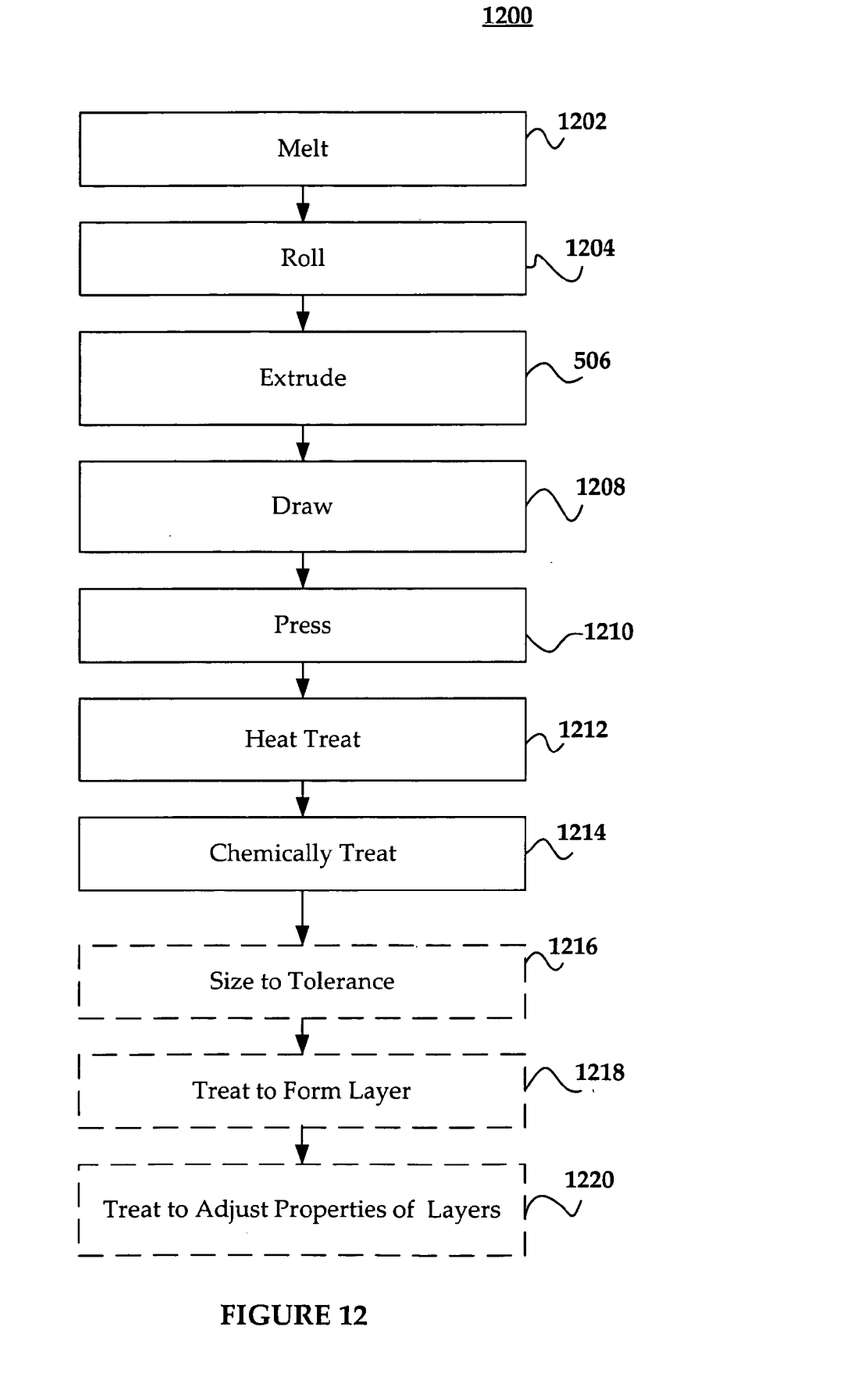
FIG. 12 is an exemplary method for manufacturing a bonding tool tip with resistance through fusion casting.

Bonding tools with tip resistance can be manufactured through the use of mixing, molding, and sintering reactive powders as shown in FIG. 10; the use of hot pressing reactive powders as shown in FIG. 11; and through fusion casting as shown in FIG. 12.

Referring now to FIG. 10, an exemplary flowchart 1000 for manufacturing bonding tools with tip resistance is shown. Through the use of mixing, molding, and sintering reactive powders—for example, alumina ($Al_2O_3$), zirconia ($Zr_2O_3$), iron oxide ($FeO_2$), or titanium oxide ($Ti_2O_3$)—fine particles (e.g., a half of a micron in size) of a desired composition are mixed 1002 with organic and inorganic solvents, dispersants, binders, and sintering aids. The binder and/or the sintering aids could be any of, any combination of, or all of magnesia, yttria, boron, carbon colloidal silica, alumina solvents, ethyl silicate, any phosphate, any rare earth metal oxide, or yttrium. Solvents, too, could be any of the aforementioned elements, compounds, or combination in addition to $H_2O$, for example.

The mixture is then molded 1004 into oversized wedges. The wedges are carefully dried and slowly heated 1006 to remove the binders and dispersants. In one embodiment, the wedges are heated to a temperature between 500–2500 degrees Celsius.

The wedges are then heated to a high enough temperature so that the individual particles sinter together 1008 into a solid structure with low porosity. In one embodiment, the wedges are heated to at least a temperature of 4000 degrees Celsius. The heat-treating atmosphere is chosen to facilitate the removal of the binder at a low temperature and to control the valence of the dopant atoms at the higher temperature and while cooling 1010. After cooling 1010, the wedges may be machined 1012 to achieve required tolerances.

The wedges may then be treated 1014 to produce a desired surface layer (e.g., 100 to 1000 Angstroms thick) by ion implementation, vapor deposition, chemical vapor deposition, physical deposition, electroplating deposition, neutron bombardment, or combinations of the above. The pieces may be subsequently heat treated 1016 in a controlled atmosphere (e.g., 2000 to 2500 degrees Celsius for 3 to 5 minutes) to produce desired layer properties through diffusion, re-crystallization, dopant activation, or valence changes of metallic ions.

Referring now to FIG. 11, an exemplary flowchart 1100 for manufacturing bonding tools with tip resistance using hot pressing reactive powders is shown. Through the use of hot pressing reactive powders—like those disclosed above—fine particles of a desired composition are mixed 1102 with binders and sintering aids, like those disclosed above. The mixture is then pressed 1104 in a mold at a high enough temperature (e.g., 1000 to 4000 degrees Celsius) to cause consolidation and binding of the individual particles into a solid structure with low porosity (e.g., having grain size of less than half a micron in size). In one embodiment, the temperature is between 1000 and 2500 degrees Celsius. The hot pressing atmosphere is chosen to control the valence of the dopant atoms.

After cooling and removal 1106 from the hot press, the pieces may be machined 1108 to achieve required tolerances. The pieces may then be treated 1110 to produce a desired surface layer by ion implementation, vapor deposition, chemical vapor deposition, physical deposition, electoplating deposition, neutron bombardment, or combinations of the above.

The pieces may subsequently be heat treated 1112 in a controlled atmosphere to produce desired layer properties through diffusion, re-crystallization, dopant activation, or valence changes of metallic ions.

Referring now to FIG. 12, an exemplary flowchart 1200 for manufacturing bonding tools with tip resistance using fusion casting is shown. Through fusion casting, metals of a desired composition are melted 1202 in a non-reactive crucible before being cast into an ingot. The ingot is then rolled 1204, extruded 1206, drawn 1208, pressed 1210, heat-treated 1212 (e.g., at 1000 degrees Celsius or 500 degrees Celsius to 2500 degrees Celsius for one to two hours) in a suitable atmosphere, and chemically treated 1214.

The rolling 1204, extruding 1206, drawing 1208, and pressing 1210 steps shape the tip, while heat treatment 1212 and chemical treatment 1214 steps affect or impart mechanical and electrical properties such as hardness and resistivity.

The pieces may then be machined 1216 to achieve required tolerances. The metallic pieces may also be treated to produce a desired surface layer 1218 by vapor deposition, chemical vapor deposition, physical deposition, electroplating deposition, or combinations of the above.

The pieces may subsequently be heat-treated (e.g., 4000 degrees Celsius for three to four hours) in a controlled atmosphere to produce desired layer properties 1220 through diffusion, re-crystallization, dopant activation, or valence changes of metallic ions.

The present invention further provides that the layer used in the bonding process may be the following composition of matter; for example, a formula for dissipated ceramic comprising alumina (aluminum oxide $Al_2O_3$) and zirconia (zirconium oxide $ZrO_2$) and other elements. This mixture is both somewhat electrically conductive and mechanically durable. The tip of a bonding tool will be coated with this material or it could be made completely out of this material. The shape of the tip may be as shown and described in earlier FIGS. 1 to 5. One actual sample was constructed with silicon carbide.

The bonding tip of the present invention can be used for any number of different types of bonding. Two examples are ultrasonic and thermal flip chip bonding.

While the present invention has been described with reference to exemplary embodiments, it will be understood by those skilled in the art that various changes may be made and equivalents may be substituted for elements thereof without departing from the true spirit and scope of the present invention. In addition, modifications may be made without departing from the essential teachings of the present invention.

What is claimed is:

1. A resistive bonding tool tip comprising resistive material for use in bonding machines for connecting leads on integrated circuit bonding pads, wherein the resistive material has a resistance low enough to discharge a small voltage in a device being bonded at a rate of less than 5 milliamps of current and high enough to avoid current flow large enough to damage the device being bonded.

2. The resistive bonding tool tip of claim 1, wherein the resistive material comprises a resistance in the range of 500 to 99,999 ohms.

3. The resistive bonding tool tip of claim 1, wherein the tip comprises a high enough stiffness to resist bending when hot.

4. The resistive bonding tool tip of claim 1, wherein the tip comprises a high enough abrasiveness to function for at least 30,000 uses.

5. The resistive bonding tool tip of claim 1, wherein the resistive material is an extrinsic semi-conducting material that has dopant atoms in an appropriate concentration and valence states to produce the resistance.

6. The resistive bonding tool tip of claim 5, wherein the resistive material further comprises a polycrystalline silicon carbide.

7. The resistive bonding tool tip of claim 6, wherein the polycrystalline silicon carbide is uniformly doped with boron.

8. The resistive bonding tool tip of claim 1, wherein the resistive material comprises a doped semi-conductor formed on an insulating core.

9. The resistive bonding tool tip of claim 8, wherein the insulating core is comprised of diamond.

10. The resistive bonding tool tip of claim 9, wherein the doped semi-conductor further comprises an outer surface of the diamond that is ion implanted with boron.

11. The resistive bonding tool tip of claim 1, wherein the resistive material comprises a doped semi-conductor formed on a conducting core.

12. The resistive bonding tool tip of claim 11, wherein the conducting core is comprised of a cobalt-bonded tungsten carbide.

13. The resistive bonding tool tip of claim 12, wherein the cobalt-bonded tungsten carbide is coated with titanium nitride carbide.

* * * * *

Disclaimer 7,032,802—Steven F. Reiber, Rocklin, CA (US). BONDING TOOL WITH RESISTANCE. Patent dated April 25, 2006. Disclaimer filed December 7, 2009 by Inventor and Owner, Steven F. Reiber.

Hereby enters this disclaimer to claims 5-13 of said patent.

*(Official Gazette, April 13, 2010)*